(12) United States Patent
Park et al.

(10) Patent No.: US 11,641,768 B2
(45) Date of Patent: May 2, 2023

(54) DISPLAY PANEL HAVING CONDUCTIVE MEMBERS CONTACTING PAD AT OPENING IN DISPLAY PANEL LAYER

(71) Applicant: Samsung Display Co., LTD., Yongin-si (KR)

(72) Inventors: JeongJin Park, Hwaseong-si (KR); Atsushi Nemoto, Suwon-si (KR); Young-Min Park, Yongin-si (KR); Taeho Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 57 days.

(21) Appl. No.: 17/017,888

(22) Filed: Sep. 11, 2020

(65) Prior Publication Data
US 2021/0217840 A1 Jul. 15, 2021

(30) Foreign Application Priority Data
Jan. 10, 2020 (KR) .................. 10-2020-0003425

(51) Int. Cl.
*H01L 27/32* (2006.01)
*H01L 51/56* (2006.01)
*H01L 51/52* (2006.01)

(52) U.S. Cl.
CPC ...... *H01L 27/3276* (2013.01); *H01L 51/5246* (2013.01); *H01L 51/56* (2013.01)

(58) Field of Classification Search
CPC .. H01L 27/3276; H01L 51/5246; H01L 51/56
USPC .......................................................... 257/40
See application file for complete search history.

(56) References Cited

U.S. PATENT DOCUMENTS

| | | | |
|---|---|---|---|
| 8,387,236 B2 | 3/2013 | Nebashi et al. | |
| 2017/0271299 A1 | 9/2017 | Li et al. | |
| 2017/0338198 A1* | 11/2017 | Jang | H01L 24/32 |
| 2017/0352716 A1* | 12/2017 | Lee | H01L 24/29 |
| 2018/0020543 A1* | 1/2018 | Kim | H05K 1/181 |
| 2019/0148320 A1* | 5/2019 | Chu | H01L 24/83 |
| | | | 257/88 |

FOREIGN PATENT DOCUMENTS

| | | |
|---|---|---|
| KR | 1020080011842 A | 2/2008 |
| KR | 10-1145023 B1 | 5/2012 |
| KR | 1020170130675 A | 11/2017 |
| KR | 1020190081894 A | 7/2019 |

* cited by examiner

*Primary Examiner* — Matthew E. Gordon
(74) *Attorney, Agent, or Firm* — Cantor Colburn LLP

(57) ABSTRACT

A display device includes a display panel including a first pad on a base substrate, an adhesive pattern which faces the base substrate with the first pad therebetween, a circuit board electrically connected to the display panel at the first pad and including a second pad facing the first pad, and a plurality of conductive members between the first pad and the second pad to electrically connect the first pad and the second pad to each other. The first pad of the display panel has a planar shape, and each of the plurality of conductive members is within the planar shape of the first pad and penetrates the adhesive pattern to contact the first pad.

16 Claims, 13 Drawing Sheets

DISPLAY PANEL HAVING CONDUCTIVE MEMBERS CONTACTING PAD AT OPENING IN DISPLAY PANEL LAYER

This application claims priority to Korean Patent Application No. 10-2020-0003425, filed on Jan. 10, 2020, and all the benefits accruing therefrom under 35 U.S.C. § 119, the entire contents of which are hereby incorporated by reference.

BACKGROUND

(1) Field

The present disclosure relates to a display device, and in particular, to a display panel, a method of fabricating the display panel, and a display device including the display panel.

(2) Description of the Related Art

Various display devices are developed for use in multimedia devices, such as televisions, mobile phones, tablet computers, navigation systems and gaming machines.

The display device includes a display panel displaying an image. The display panel includes a plurality of gate lines, a plurality of data lines, and a plurality of pixels connected to the gate and data lines. The display device includes a circuit board providing electrical signals, which are used to display the image, to the gate or data lines.

The circuit board is bonded to a portion of the display panel to provide the electrical signals to the pixels of the display panel.

SUMMARY

An embodiment provides a display panel, which is bonded to a circuit board in a highly reliable manner, a method of fabricating the display panel, and a display device including the display panel.

According to an embodiment, a display device includes a display panel including a first pad on a base substrate, an adhesive pattern which faces the base substrate with the first pad therebetween, a circuit board electrically connected to the display panel at the first pad and including a second pad facing the first pad, and a plurality of conductive members between the first pad and the second pad to electrically connect the first pad and the second pad to each other. The first pad of the display panel has a planar shape, and each of the plurality of conductive members is within the planar shape of the first pad and penetrates the adhesive pattern to contact the first pad.

In an embodiment, at least a portion of the adhesive pattern may be spaced apart from the second pad.

In an embodiment, the adhesive pattern may be on the base substrate to entirely cover the first pad.

In an embodiment, the first pad and the second pad may be spaced apart from each other with the conductive members therebetween.

In an embodiment, the display panel may further include an insulating layer, which is on the base substrate, and in which a contact hole is defined. The first pad may be on the insulating layer to cover the contact hole.

In an embodiment, the conductive members may be on the first pad to be overlapped with the contact hole.

In an embodiment, a portion of the second pad corresponding to the contact hole may be spaced apart from the first pad, and another portion of the second pad, which is not corresponding to the contact hole, may be in contact with the first pad.

In an embodiment, the conductive members may be entirely overlapped with the contact hole.

In an embodiment, the display panel may further include an insulating layer between the first pad and the base substrate, and the first pad may define at least one opening exposing the insulating layer.

In an embodiment, at least one of the conductive members may extend into the opening.

In an embodiment, along the base substrate, each of the plurality of conductive members and the opening may define a planar area, and the planar area of the opening may be smaller than the planar area of each of the plurality of conductive members.

According to an embodiment, a display panel includes a pad on a base substrate, an adhesive pattern which corresponds to the pad and faces the base substrate with the pad therebetween, and conductive members on the base substrate, the conductive members including main conductive members each corresponding to the pad and extended into the adhesive pattern. Each of the main conductive members includes a portion which is further from the base substrate than the adhesive pattern.

In an embodiment, the adhesive pattern overlapped with the pad may have a same thickness relative to the pad.

In an embodiment, along the base substrate, the pad defines a planar area, the conductive members further include sub-conductive members which are on the base substrate and outside of the planar area of the pad, and a ratio of the sub-conductive members to the main conductive members ranges from about 1% to about 5%.

In an embodiment, the conductive members may be in contact with the pad.

In an embodiment, the display panel may further include an insulating layer between the pad and the base substrate. The pad may define at least one opening exposing the insulating layer, and at least one of the conductive members may be in the opening.

According to an embodiment, a method of providing a display panel includes providing a base substrate including a pad region through which an electrical signal is provided to the display panel from outside thereof, and a cutting region adjacent to the pad region, providing on the base substrate, a plurality of pads spaced apart from each other in the pad region, and a connection pad which is in the cutting region and connected to each of the plurality of pads at ends thereof, where each of the plurality of pads and the connection pad defines a planar area along the base substrate, providing a plurality of conductive members on the base substrate, in each of the pad region and the cutting region, the plurality of conductive members including main conductive members corresponding to planar areas of the plurality of pads and to the connection pad, and sub-conductive members outside of the planar areas of the plurality of pads and the connection pad, providing the sub-conductive members to correspond to the planar area of one of the plurality of pads or to the planar area of the connection pad, by using a magnet; and providing the cutting region separated from a remaining portion of the base substrate, the remaining portion of the base substrate including the plurality of pads with the main conductive members and the sub-conductive members corresponding to the planar areas of the plurality of pads.

In an embodiment, the pads and the connection pad may form a single conductive pattern on the base substrate.

In an embodiment, the method may further include after the providing the sub-conductive members to correspond to the planar area of one of the plurality of pads, providing an adhesive pattern respectively on the plurality of pads and having a constant thickness relative to a respective pad among the plurality of pads.

In an embodiment, conductive members among the plurality of conductive members, which correspond to the respective pad among the plurality of pads, respectively have heights relative to the respective pad, the adhesive pattern has a thickness relative to the respective pad, and the heights of the conductive members are greater than the thickness of the adhesive pattern.

BRIEF DESCRIPTION OF THE DRAWINGS

Embodiments will be more clearly understood from the following brief description taken in conjunction with the accompanying drawings. The accompanying drawings represent non-limiting, embodiments as described herein.

Figure 1A:
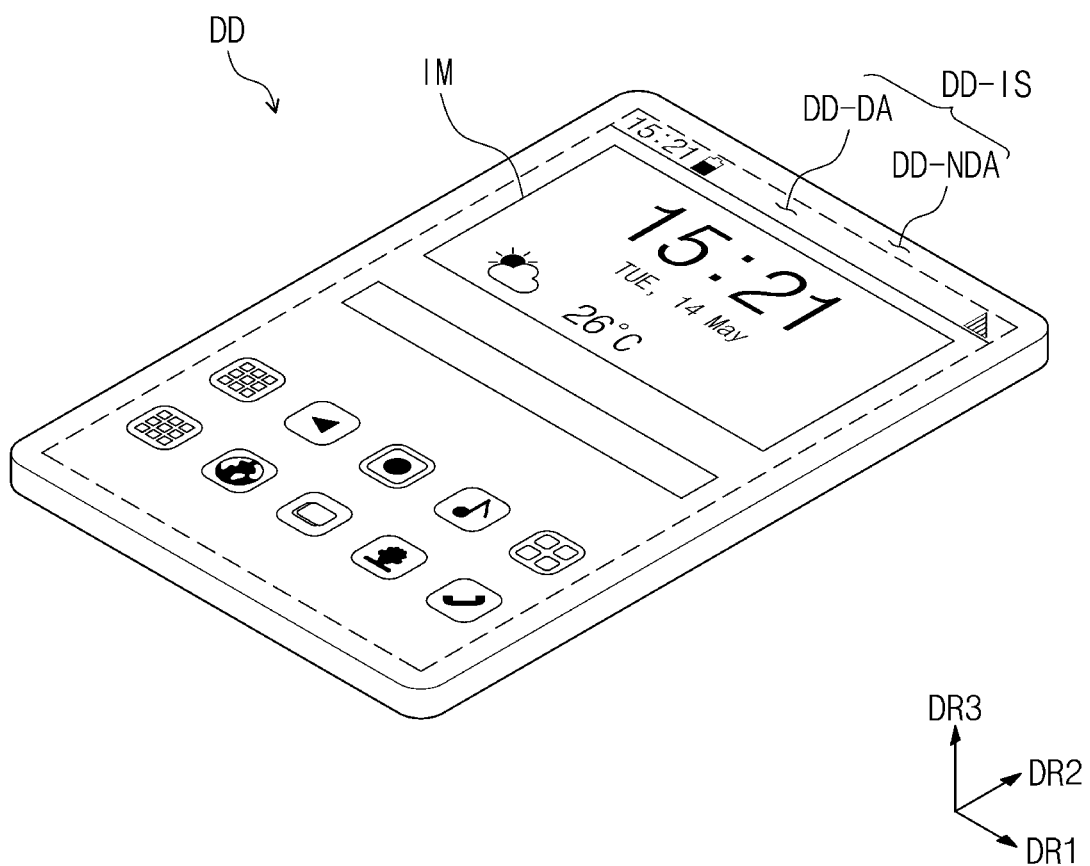
FIG. 1A is a perspective view illustrating an embodiment of a display device.

It should be noted that these figures are intended to illustrate the general characteristics of methods, structure and/or materials utilized in embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments will now be described more entirely with reference to the accompanying drawings, in which embodiments are shown. Embodiments may, however, be embodied in many different forms and should not be construed as being limited to the embodiments set forth herein; rather, these embodiments are provided so that this disclosure will be thorough and complete, and will entirely convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present. Like numbers indicate like elements throughout.

As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of embodiments. As used herein, the singular forms "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Embodiments are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
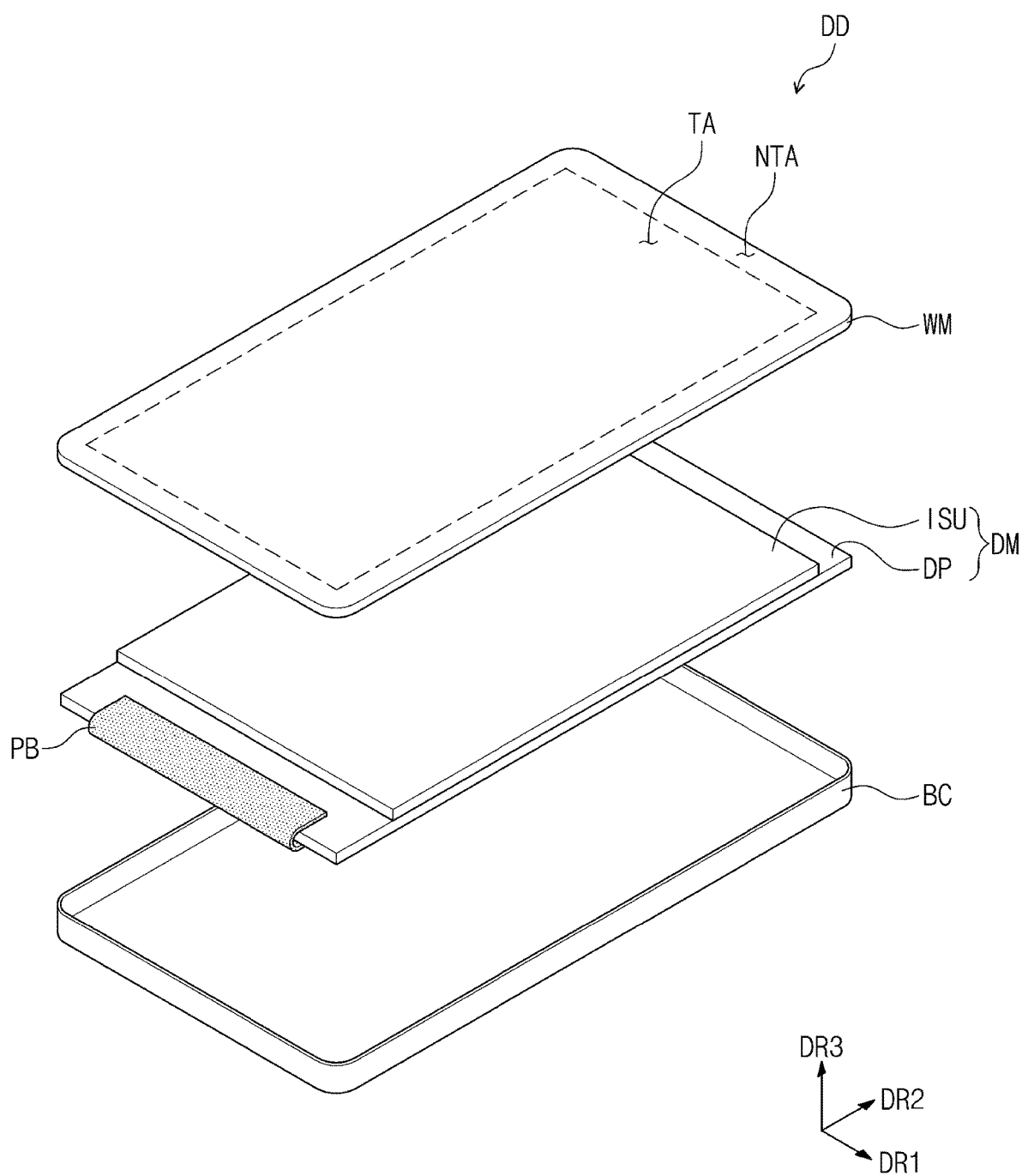
FIG. 1B is an exploded perspective view illustrating an embodiment of a display device.
Figure 2:
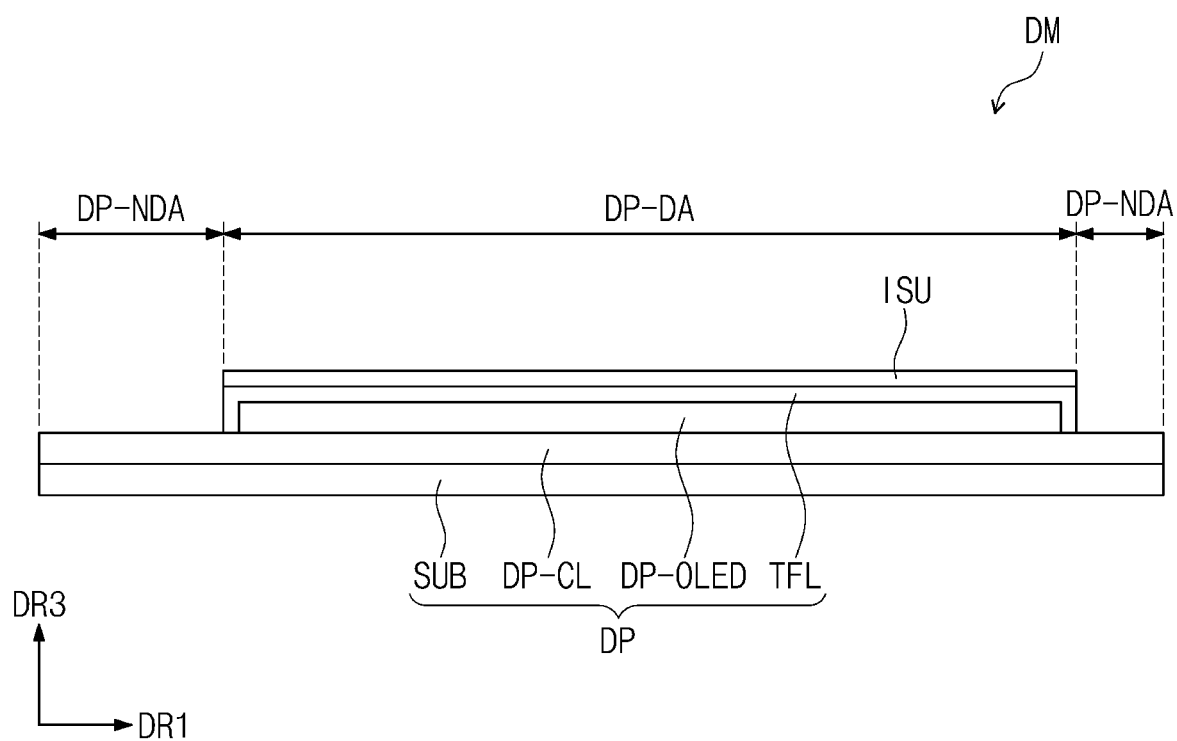
FIG. 2 is a cross-sectional view illustrating an embodiment of a display module.

FIG. 1A is a perspective view illustrating an embodiment of a display device DD. FIG. 1B is an exploded perspective view illustrating an embodiment of a display device DD. FIG. 2 is a cross-sectional view illustrating an embodiment of a display module DM.

In the present specification, a display device DD, which can be used for a cellphone terminal, is exemplarily illustrated. Although not shown, the cellphone terminal may further include an electronic module, a camera module, a power module and so forth, which are mounted on a mainboard and are provided in a bracket or case, along with the display device DD. The display device DD may be used for relatively large-sized electronic devices (e.g., television sets and display monitors) or relatively small-sized or medium-sized electronic devices (e.g., tablets, car navigation systems, game machines and smart watches).

Referring to FIG. 1A, the display device DD may include a display surface DD-IS, which is used to display an image IM. As an example of the image IM, icon images are shown in FIG. 1A. The display surface DD-IS may be parallel to a plane defined by a first direction DR1 and a second direction DR2 which crosses the first direction DR1.

A normal direction to the display surface DD-IS (e.g., a thickness direction of the display device DD or various components thereof) will be referred to as a third direction DR3. In the present specification, the expression "when viewed in a plan view" or "in a plan view" may be used to describe a shape of an object viewed along the third direction DR3. Hereinafter, the third direction DR3 may be used to differentiate a front or top surface of the display device DD or various components, layers or units thereof, from a back or bottom surface. However, directions indicated by the first to third directions DR1, DR2 and DR3 may be a relative concept, and in an embodiment, they may be changed to other (e.g., opposite) directions.

In addition, the display surface DD-IS may include a display region DD-DA in which the image IM is generated and/or displayed, and a non-display region DD-NDA which is adjacent to the display region DD-DA. The image IM may not be generated and/or displayed in non-display region DD-NDA. However, the invention is not limited to this example, and in an embodiment, the non-display region DD-NDA may be disposed adjacent to at least one edge of the display region DD-DA, or may be omitted from the display device DD. Components, layers and/or elements of the display device DD may have planar areas corresponding to the display region DD-DA and the non-display region DD-NDA described above.

Referring to FIG. 1B, the display device DD may include a window WM (e.g., window member), a display module DM, a circuit board PB, and a housing member BC (e.g., bottom housing or bottom chassis). The housing member BC may receive the display module DM therein, and may be coupled to the window WM. The housing member BC and the window WM may form an outer surface or outer member of the display device DD.

The window WM may be disposed on the display module DM (e.g., along a light-emitting direction or image-displaying direction). An image IM which is provided from the display module DM, may be transmitted through the window WM to outside the display device DD. The window WM may include a transmission region TA and a non-transmission region NTA. The transmission region TA may be overlapped with the display region DD-DA and may have a planar shape corresponding to a planar shape of the display region DD-DA. The image IM, which is displayed on the display region DD-DA of the display device DD, may be provided to outside the display device DD through the transmission region TA of the window WM. The image IM may be displayed and/or light may be transmitted at the transmission region TA.

The non-transmission region NTA may be overlapped with the non-display region DD-NDA and may have a planar shape corresponding to a planar shape the non-display region DD-NDA. The non-transmission region NTA may have relatively low optical transmittance, compared with optical transmittance of the transmission region TA. However, the invention is not limited to this example, and in an embodiment, the non-transmission region NTA may be omitted.

The window WM may include or be formed of, for example, glass, sapphire, plastic or the like. Although the window WM is illustrated to have a single-layered structure, the window WM may include a plurality of layers. The window WM may include a base layer and at least one printing layer, which is disposed on a rear surface of the base layer. The printing layer may be overlapped with or corresponding to the non-transmission region NTA. The printing layer may have a specific color. As an example, the printing layer may have a black color or other color. The printing layer may block light or restrict light transmission.

The display module DM may be disposed between the window WM and the housing member BC. The display module DM may include a display panel DP and an input-sensing layer ISU. The display panel DP may generate an image and transmit the generated image to the window WM.

In an embodiment, the display panel DP may be a light emitting type display panel, but the invention is not limited to a specific type of the display panel DP. For example, the display panel DP may be an organic light emitting display panel or a quantum dot light emitting display panel. An emission layer of the organic light emitting display panel may be provided or formed of or include an organic luminescent material. An emission layer of the quantum dot light emitting display panel may include a quantum dot, a quantum rod, or the like. Hereinafter, an example, in which the display panel DP is the organic light emitting display panel, will be described.

Hereinafter, an example, in which the display panel DP is the organic light emitting display panel, will be described. However, the invention is not limited to this example and may be applied to realize various display panels.

The circuit board PB may be overlapped with (e.g., correspond to) the non-display region DD-NDA, and may be disposed on the display panel DP. The circuit board PB may generate driving signals as electrical signals, which are transmitted to the display panel DP from outside thereof, to operate the display panel DP. The circuit board PB may provide the driving signals to the display panel DP.

In an embodiment, the circuit board PB may be electrically connected to the display panel DP, such as in an ultrasonic bonding manner. In an embodiment, for example, the display panel DP may include a first pad corresponding to the non-display region DD-NDA, and the circuit board PB may include a second pad corresponding to the first pad, such as facing the first pad along a thickness direction of the display panel DP. For convenience in description, an example, in which a pair of pads (e.g., the first and second pads) is included, will be described, but the invention is not limited to this example. In an embodiment, for example, the display panel DP may include a plurality of first pads, and the circuit board PB may include a plurality of second pads respectively corresponding to the plurality of first pads.

In an embodiment, the display panel DP may include a conductive ball CB provided in plurality (e.g., conductive balls CB) disposed corresponding to the first pad, which will be described with reference to FIG. 4B. The conductive balls CB may correspond to a same one of the first pad. In an embodiment of manufacturing the display device DD, the conductive balls CB may be provided or formed on the first pad, before bonding the display panel DP to the circuit board PB in the ultrasonic bonding manner. According to an embodiment, the conductive balls CB on the first pad may be exposed to outside the display panel DP and/or the display device DD, unlike a structure of an anisotropic conductive film, in which conductive balls CB are distributed in and covered by an adhesive layer such as a resin.

The conductive balls CB may be disposed between the first pad of the display panel DP and the second pad of the circuit board PB, and may electrically connect the first pad and the second pad to each other. In an embodiment, for example, each of the conductive balls CB and the second pad of the circuit board PB may be formed of or include a metallic material, and the conductive balls CB which include the metallic material, may be bonded to the first pad of the circuit board PB, such as by an ultrasonic bonding process. In addition, the first pad of the display panel DP may also be formed of or include a metallic material and may be attached to the conductive balls CB. Accordingly, electrical signals which are output from the circuit board PB, may be transmitted to the display panel DP through the second pad, the conductive balls CB and the first pad in order.

As an example, the second pad of the circuit board PB may be directly bonded to each of the conductive balls CB and a portion of the first pad by an ultrasonic bonding process. In an embodiment, for example, the second pad may include a first portion which is spaced apart from the first pad, and a second portion which is in contact with the first pad. As another example, the second pad of the circuit board PB may be directly bonded to the conductive balls CB which are disposed on the first pad, by an ultrasonic bonding process, but may be substantially spaced apart from the first pad. This will be described in more detail below.

Referring to FIG. 2, the display panel DP may include a base substrate SUB and a circuit device layer DP-CL, a display device layer DP-OLED and an insulating layer TFL, which are disposed in order on the base substrate SUB.

The display panel DP may include a display area DP-DA and a non-display area DP-NDA. The display area DP-DA of the display panel DP may correspond to the display region DD-DA shown in FIG. 1A, and the non-display area DP-NDA may correspond to the non-display region DD-NDA shown in FIG. 1A.

The base substrate SUB may include a plastic film. The base substrate SUB may be flexible and may include a plastic substrate, a glass substrate, a metal substrate or a substrate including an organic/inorganic composite material.

The circuit device layer DP-CL may include an intermediate insulating layer and a circuit device. In an embodiment, the intermediate insulating layer may include an intermediate inorganic layer and an intermediate organic layer. The circuit device may include one or more signal line, a pixel driving circuit, and so forth.

The display device layer DP-OLED may include one or more of a display element or a light-emitting device, such as a plurality of organic light emitting diodes. The display device layer DP-OLED may further include an organic material layer, such as a pixel definition layer. Alternatively, the display panel DP may be a liquid crystal display panel, and in this case, the display device layer DP-OLED may include a liquid crystal material layer.

The insulating layer TFL may hermetically seal or encapsulate the display device layer DP-OLED, together with other layers of the display panel DP. The insulating layer TFL is disposed facing the base substrate SUB with each of the circuit device layer DP-CL and the display device layer DP-OLED therebetween. As an example, the insulating layer TFL may be a thin-film encapsulation layer. The insulating layer TFL may protect the display device layer DP-OLED from a contamination material, such as moisture, oxygen and/or dust particles. However, the invention is not limited to this example, and in an embodiment, an encapsulation substrate may be provided instead of the insulating layer TFL. In this case, the encapsulation substrate may be disposed to face the base substrate SUB, and the circuit device layer DP-CL and the display device layer DP-OLED may be disposed between the encapsulation substrate and the base substrate SUB.

The input-sensing layer ISU may be disposed between the window WM and the display panel DP. The input-sensing layer ISU may sense an external input provided from outside the display module DM and/or the display device DD. Such an external input may be provided in various forms. In an embodiment, for example, the external input may include light, heat or pressure provided from an input tool such as a part of a user, a stylus pen, etc. The external input may include a non-touching-type event (e.g., a hovering event near the input-sensing layer ISU), in addition to such a touching-type event caused by contact from the input tool.

The input-sensing layer ISU may be directly disposed on the display panel DP, without being limited thereto. In the present specification, the expression "an element A may be directly disposed on an element B" means that an intervening element such as a fixing member or an adhesive layer is not disposed between the elements A and B. In an embodiment of a method of manufacturing the display device DD, the input-sensing layer ISU and the display panel DP may be fabricated through a consecutive process. However, the invention is not limited to this example, and in an embodiment, the input-sensing layer ISU may be provided in the form of an individual panel separate from the display panel DP, and may be connected to the display panel DP such as by using an adhesive layer. In an embodiment, the input-sensing layer ISU may be omitted.

Figure 3:
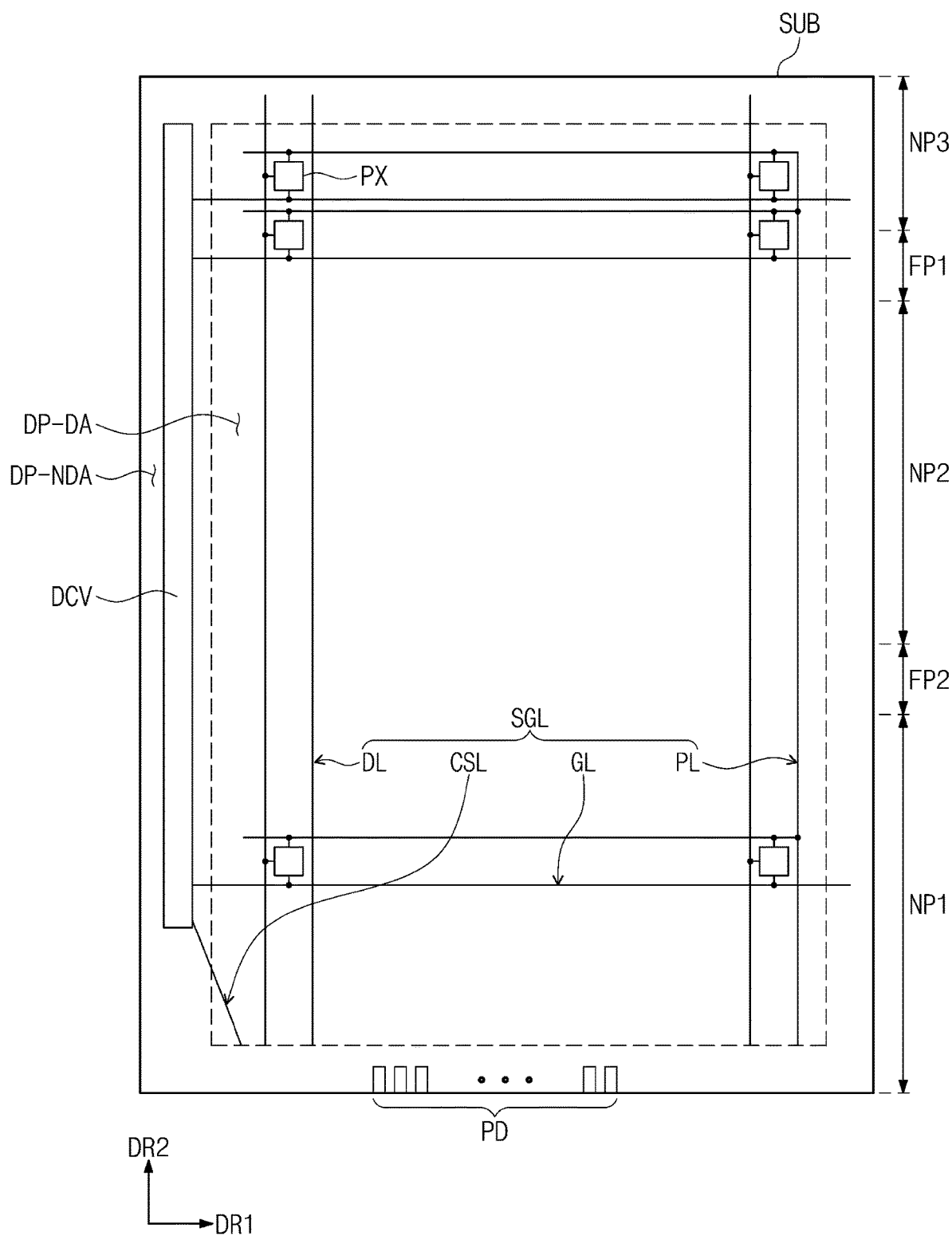
FIG. 3 is a plan view illustrating an embodiment of a display panel.

FIG. 3 is a top plan view illustrating an embodiment of a display panel DP.

Referring to FIG. 3, the display panel DP may include a driving circuit DCV, a plurality of signal lines SGL, a pixel PX provided in plurality (e.g., a plurality of pixels PX), and a plurality of driving pads PD. The driving circuit DCV, the signal lines SGL, the pixels PX, and the driving pads PD (e.g., plurality of pads) may be disposed on the base substrate SUB.

The pixels PX may be disposed in the display area DP-DA and may be electrically connected to the signal lines SGL. The driving circuit DCV, the signal lines SGL, and a pixel driving circuit which is used to control operations of the pixels PX, may be included in the circuit device layer DP-CL of FIG. 2.

The driving circuit DCV may generate a plurality of scan signals as electrical signals and may sequentially output the scan signals to a gate line GL provided in plurality (e.g., a plurality of gate lines GL), which will be described below. In an embodiment, the driving circuit DCV may output additional control signals as electrical signals, to the pixel driving circuit to control the pixels PX for generating light, emitting light, displaying an image, etc.

The driving circuit DCV may include a plurality of thin film transistors, which are provided or formed by a same process (e.g., a low temperature polycrystalline silicon ("LTPS") process or a low temperature polycrystalline oxide ("LTPO") process) as that for providing portions of the pixel driving circuit.

The signal lines SGL may include gate lines GL, a data line DL provided in plurality (e.g., data lines DL), a power line PL and a control signal line CSL. Each of the gate lines GL may be connected to corresponding ones of the pixels PX, and each of the data lines DL may be connected to corresponding ones of the pixels PX. The power line PL may be connected to the plurality of the pixels PX. The driving circuit DCV, to which the gate lines GL are connected, may be disposed in the non-display area DP-NDA. The control signal line CSL may be used to provide the control signals from the driving circuit DCV and to the pixels PX.

A first layer, pattern or portion of the gate lines GL, the data lines DL, the power line PL and the control signal line CSL may be disposed in a same layer as each other, while a second layer, pattern or portion is disposed in another layer, among layers on the base substrate SUB.

The display panel DP may include the driving pads PD, which correspond to and disposed in the non-display area DP-NDA and are disposed on the base substrate SUB. The driving pads PD may be arranged with a specific distance therebetween, along the first direction DR1. FIG. 3 shows the driving pads PD are arranged in a single row, but in an embodiment, the driving pads PD may be arranged to form two rows which are distinct from each other along the second direction DR2.

The driving pads PD may be electrically connected to the data lines DL, the power line PL and the control signal line CSL among the signal lines SGL. The driving pads PD may be used to provide driving signals as electrical signals to corresponding ones of the signal lines SGL. An electrical signal from outside the display panel DP, may be provided to the display panel DP through the driving pads PD. In the present specification, the driving pads PD may correspond to the first pads previously described with reference to FIG. 1B.

Figure 4A:
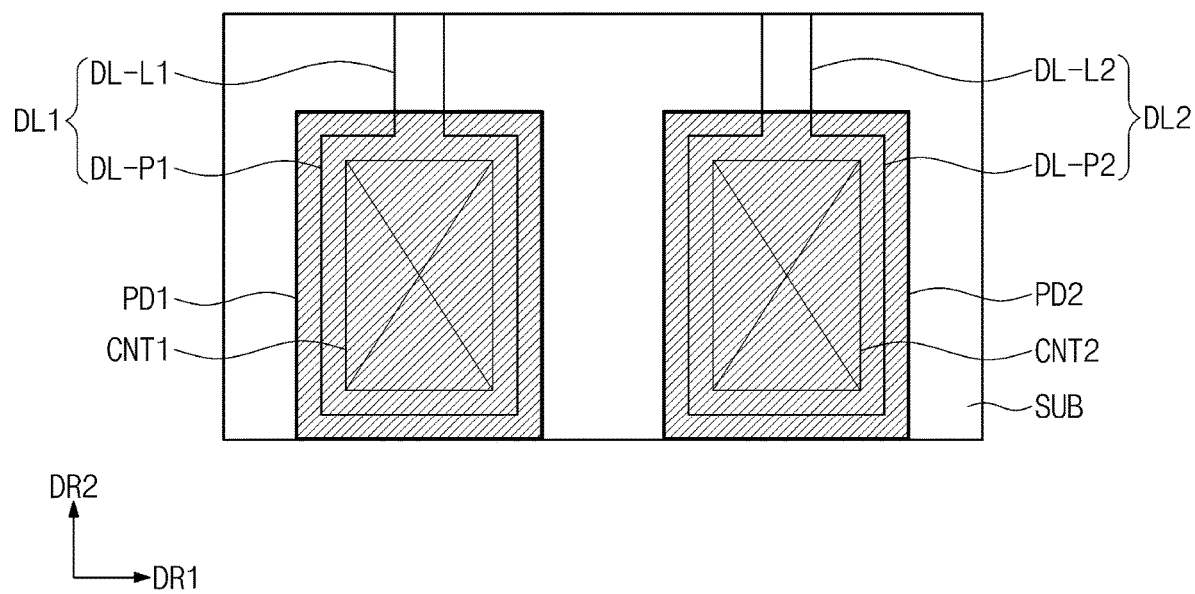
FIG. 4A is a plan view illustrating an embodiment of a display panel including driving pads of FIG. 3.

FIG. 4A is a top plan view illustrating an embodiment of the driving pads PD of FIG. 3. FIG. 4B is a top plan view illustrating an embodiment of the driving pads PD of FIG. 3. FIG. 5 is a cross-sectional view of an embodiment of a display device DD taken along line I-I' of FIG. 4B.

FIG. 4A illustrates two of the data lines DL (hereinafter, a first data line DL1 and a second data line DL2), which are included in the signal lines SGL of FIG. 3 and are within the non-display area DP-NDA, and two of the driving pads PD (hereinafter, a first driving pad PD1 and a second driving pad PD2) respectively connected thereto. Each of the signal lines SGL shown in FIG. 3 may have substantially the same structure as that shown in FIGS. 4A and 4B. Hereinafter, each of the signal lines SGL described with reference to FIG. 3 will be described to be a structure including a line portion and a pad portion, but the line portion and the pad portion may be provided as separate elements.

At a pad region PA including the driving pads PD, the signal lines SGL may be lengthwise extended along the second direction DR2, from an edge of the display panel DP or base substrate SUB. A planar area of portions of the signal lines SGL may be defined by a product of a dimension along the first direction DR1 and a dimension along the second direction DR2.

The first data line DL1 may include a first pad portion DL-P1 and a first line portion DL-L1. The first pad portion DL-P1 may have a planar area which is larger than a planar area of the first line portion DL-L1. Similarly, the second data line DL2 may include a second pad portion DL-P2 and a second line portion DL-L2, and the second pad portion DL-P2 may have a planar area larger than a planar area of the second line portion DL-L2.

The first driving pad PD1 (e.g., first pad pattern) may cover the first pad portion DL-P1 and may be in electric contact with the first pad portion DL-P1. In an embodiment, the display panel DP may include an insulating layer, which is disposed between the first driving pad PD1 and the first pad portion DL-P1 along the thickness direction, and a first contact hole CNT1 may be defined in the insulating layer. The first contact hole CNT1 may expose at least a portion of the first pad portion DL-P1 to outside the insulating layer. The first driving pad PD1 may extend into the first contact hole CNT1 from outside thereof and may be in electric contact with the first pad portion DL-P1 at the first contact hole CNT1.

In the present specification, an expression "an element A covers an element B" means that the element A is overlapped with the entirety of the element B, when viewed in a plan view. The element A may extend further than edges of the element B, to cover an entirety of the element B.

The second driving pad PD2 (e.g., second pad pattern) may cover the second pad portion DL-P2 and may be in electric contact with the second pad portion DL-P2. The second pad portion DL-P2 may be exposed through a second contact hole CNT2, which is one of holes defined in the insulating layer. The second driving pad PD2 may be disposed in the second contact hole CNT2 by extending into the second contact hole CNT2 from outside thereof, and may be in electric contact with the second pad portion DL-P2 at the second contact hole CNT2.

Figure 4B:
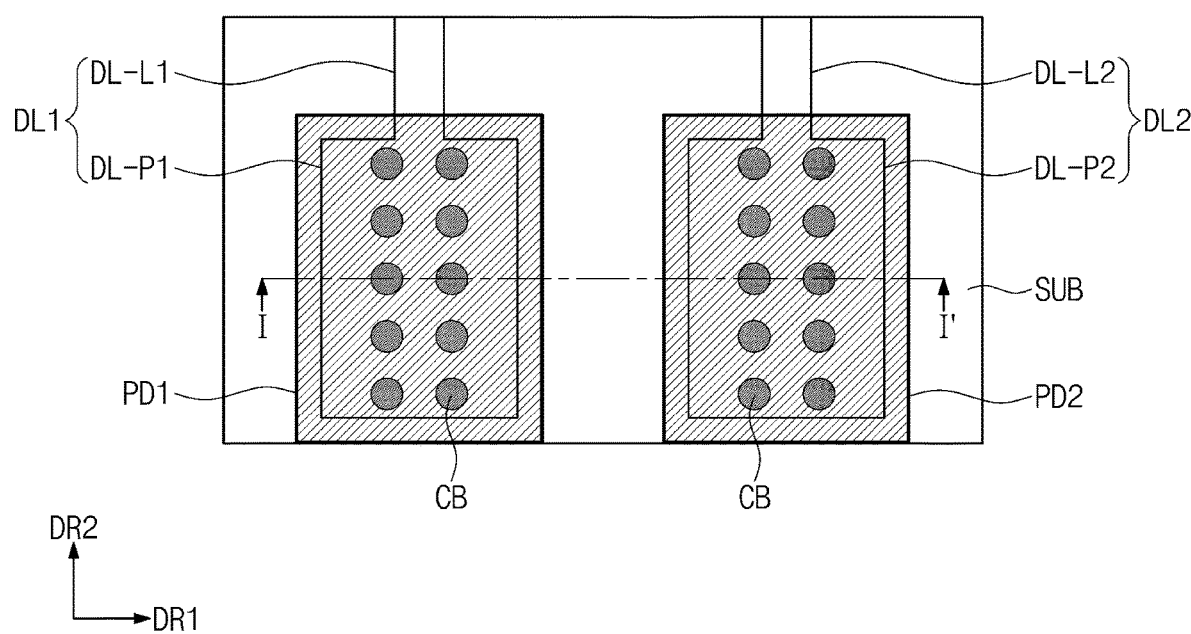
FIG. 4B is a plan view illustrating an embodiment of a display panel including driving pads of FIG. 3.
Figure 5:
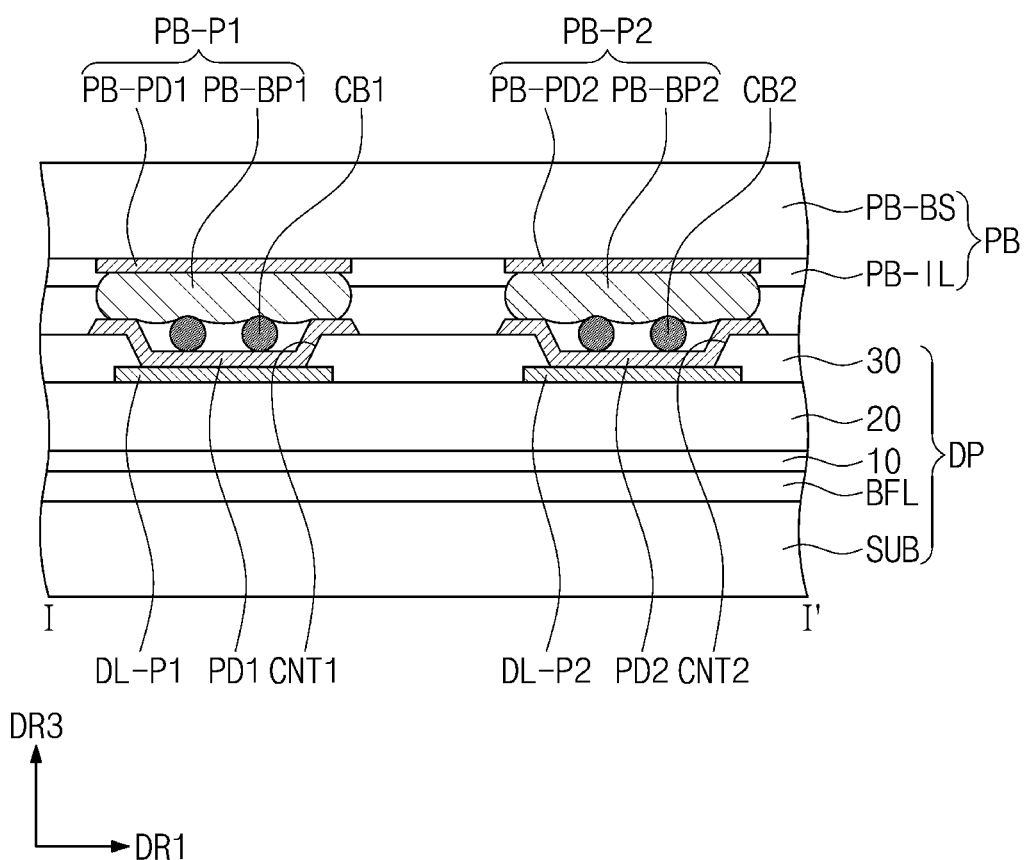
FIG. 5 is a cross-sectional view taken along line I-I' of FIG. 4B.

Referring to FIG. 4B, a plurality of the conductive balls CB may be disposed corresponding to each of the first and second driving pads PD1 and PD2 which are exposed to outside the display panel DP. FIG. 4B illustrates an example, in which the conductive balls CB are aligned with each other between the first and second driving pads PD1 and PD2, but in an embodiment, the conductive balls CB may be disposed corresponding to planar areas of the first and second driving pads PD1 and PD2 in a non-aligned manner therebetween. The description that follows will refer to an example, in which the conductive balls CB include first conductive balls CB1 and second conductive balls CB2 that respectively correspond to the first and second driving pads PD1 and PD2. The first conductive balls CB1 (e.g., first conductive members) and second conductive balls CB2 (e.g., second conductive members) may each have a discrete planar shape in the top plan view.

Referring to FIG. 5, the display panel DP may include an insulating layer which is disposed on the base substrate SUB, and the first contact hole CNT1 and the second contact hole CNT2 defined in the insulating layer.

In detail, the display panel DP may include a buffer layer BFL, a first insulating layer 10, a second insulating layer 20 and a third insulating layer 30, which are disposed in order on the base substrate SUB. The buffer layer BFL, the first insulating layer 10, the second insulating layer 20 and the third insulating layer 30 may be layers within or defining the circuit device layer DP-CL of FIG. 2 along the third direction DR3. Each of the first insulating layer 10, the second insulating layer 20 and the third insulating layer 30 may be an inorganic material layer and/or an organic material layer, and may have a single-layer structure or a multi-layered structure.

In the structure of FIG. 5, the first pad portion DL-P1 and the second pad portion DL-P2 may be disposed on the second insulating layer 20. That is, the first pad portion DL-P1 and the second pad portion DL-P2 may each face the first insulating layer 10 with the second insulating layer 20 therebetween.

The third insulating layer 30 may be disposed on the second insulating layer 20 to cover the first and second pad portions DL-P1 and DL-P2. That is, the third insulating layer 30 faces the second insulating layer 20 with each of the first and second pad portions DL-P1 and DL-P2 therebetween. In an embodiment, the first contact hole CNT1 and the second contact hole CNT2 are defined in the third insulating layer 30, where the first contact hole CNT1 and the second contact hole CNT2 expose a corresponding one of the first and second pad portions DL-P1 and DL-P2 to outside the third insulating layer 30.

A top surface of upper surface of a component, layer and/or element may be a surface which is furthest from the base substrate SUB, while a bottom surface of lower surface is a surface which is closest to the base substrate SUB. Referring to FIG. 5, for example, a top surface of the third insulating layer 30 may be exposed to outside the circuit device layer DP-CL of FIG. 2 and may face the circuit board PB along the third direction DR3.

The first driving pad PD1 may be disposed along the top surface of the third insulating layer 30 to cover an entirety of the first contact hole CNT1. The first driving pad PD1 may be in electric contact with the first pad portion DL-P1 at the first contact hole CNT1. The second driving pad PD2 may be disposed along the top surface of the third insulating layer 30 to cover an entirety of the second contact hole CNT2. The second driving pad PD2 may be in electric contact with the second pad portion DL-P2 at the second contact hole CNT2.

In an embodiment, a first conductive ball CB1 provided in plurality (e.g., first conductive balls CB1) may be disposed corresponding to the first driving pad PD1 and may each be within the first contact hole CNT1. A second conductive ball CB2 may be provided in plurality (e.g., second conductive balls CB2) may be disposed corresponding to the second driving pad PD2 and may each be within the second contact hole CNT2.

In an embodiment, the first and second conductive balls CB1 and CB2 may include a top surface or portion which is furthest from the base substrate SUB. The top surface of the first and second conductive balls CB1 and CB2 may be closer to the circuit board PB than the top surface of the third insulating layer 30 and the driving pads PD1 and PD2, along the third direction DR3. In other words, the first and second conductive balls CB1 and CB2 may have a shape protruding from the top surface of the third insulating layer 30, such that the first and second conductive balls CB1 and CB2 extend further from the base substrate SUB than the third insulating layer 30. The first and second conductive balls CB1 and CB2 extending further from the base substrate SUB than the third insulating layer 30 facilitates a connection such as by the ultrasonic bonding, between the first and second conductive balls CB1 and CB2 and the circuit board PB.

The circuit board PB may include a substrate PB-BS (e.g., circuit board substrate), a first circuit pad portion PB-P1 (e.g., first circuit board pad), a second circuit pad portion PB-P2 (e.g., second circuit board pad), and a circuit insulating layer PB-IL (e.g., fourth insulating layer). The first circuit pad portion PB-P1 and the second circuit pad portion PB-P2 may correspond to the second pads described with reference to FIG. 1B. An electrical signal may be provided to the circuit board PB from outside thereof, or from the circuit board PB to outside thereof, through one or more of the first circuit pad portion PB-P1 and the second circuit pad portion PB-P2.

The first circuit pad portion PB-P1 may include a first circuit pad PB-PD1 disposed on the substrate PB-BS and a first bump PB-BP1 disposed on the first circuit pad PB-PD1. The first bump PB-BP1 may face the first driving pad PD1 along the third direction DR3. The second circuit pad portion PB-P2 may include a second circuit pad PB-PD2 disposed on the substrate PB-BS and a second bump PB-BP2 disposed on the second circuit pad PB-PD2. The second bump PB-BP2 may face the second driving pad PD2 along the third direction DR3.

The circuit insulating layer PB-IL may be disposed on the substrate PB-BS to cover the first and second circuit pads PB-PD1 and PB-PD2. That is, the circuit insulating layer PB-IL faces substrate PB-BS with each of the first and second circuit pads PB-PD1 and PB-PD2 therebetween. Contact holes are defined in the circuit insulating layer PB-IL and expose the first and second circuit pads PB-PD1 and PB-PD2 to outside the circuit insulating layer PB-IL. The first and second bumps PB-BP1 and PB-BP2 may be in electric contact with the first and second circuit pads PB-PD1 and PB-PD2, respectively, at the contact holes defined in the circuit insulating layer PB-IL.

In an embodiment, the first bump PB-BP1 may be in electric contact with each of the first conductive balls CB1 which have a shape protruding from the top surface of the third insulating layer 30, such as through a direct bond provided by an ultrasonic bonding process. In addition, since the first conductive balls CB1 are disposed on the first driving pad PD1 and within the first contact hole CNT1, a portion of the first bump PB-BP1 may be in direct contact with the first driving pad PD1, at an extended portion of the first driving pad PD1 which is outside of a boundary or a planar area of the first contact hole CNT1.

In other words, a first portion of the first bump PB-BP1 which is overlapped with the first contact hole CNT1 may be spaced apart from the first driving pad PD1, and a second portion of the first bump PB-BP1 which extends further than the boundary of the first contact hole CNT1 may be in contact with the first driving pad PD1.

The second bump PB-BP2 may be in electric contact with each of the second conductive balls CB2 which protrude from the top surface of the third insulating layer 30, such as through a direct bond provided by an ultrasonic bonding process. In addition, since the second conductive balls CB2 are disposed on the second driving pad PD2 and within the second contact hole CNT2, a portion of the second bump PB-BP2 may be in direct contact with the second driving pad PD2, at an extended portion of the second driving pad PD2 which is outside a boundary or planar area of the second contact hole CNT2.

In other words, a first portion of the second bump PB-BP2 which is overlapped with the second contact hole CNT2 may be spaced apart from the second driving pad PD2, and a second portion of the second bump PB-BP2 which extends further than the boundary of the second contact hole CNT2 may be in contact with the second driving pad PD2.

According to the afore-described embodiment, the first and second conductive balls CB1 and CB2 may be provided or formed on the first and second driving pads PD1 and PD2 before the ultrasonic bonding process between the circuit board PB and the display panel DP. After providing the first and second conductive balls CB1 and CB2 on the first and second driving pads PD1 and PD2, the first and second conductive balls CB1 and CB2 which protrude further than the top surface of the third insulating layer 30, may be in electric contact with the bumps PB-BP1 and PB-BP2 of the circuit board PB, such as by the ultrasonic bonding process. Thus, the bonding reliability between the display panel DP and the circuit board PB may be improved owing to the bond between the first and second conductive balls CB1 and CB2 and the first and second driving pads PD1 and PD2, respectively.

Figure 6:
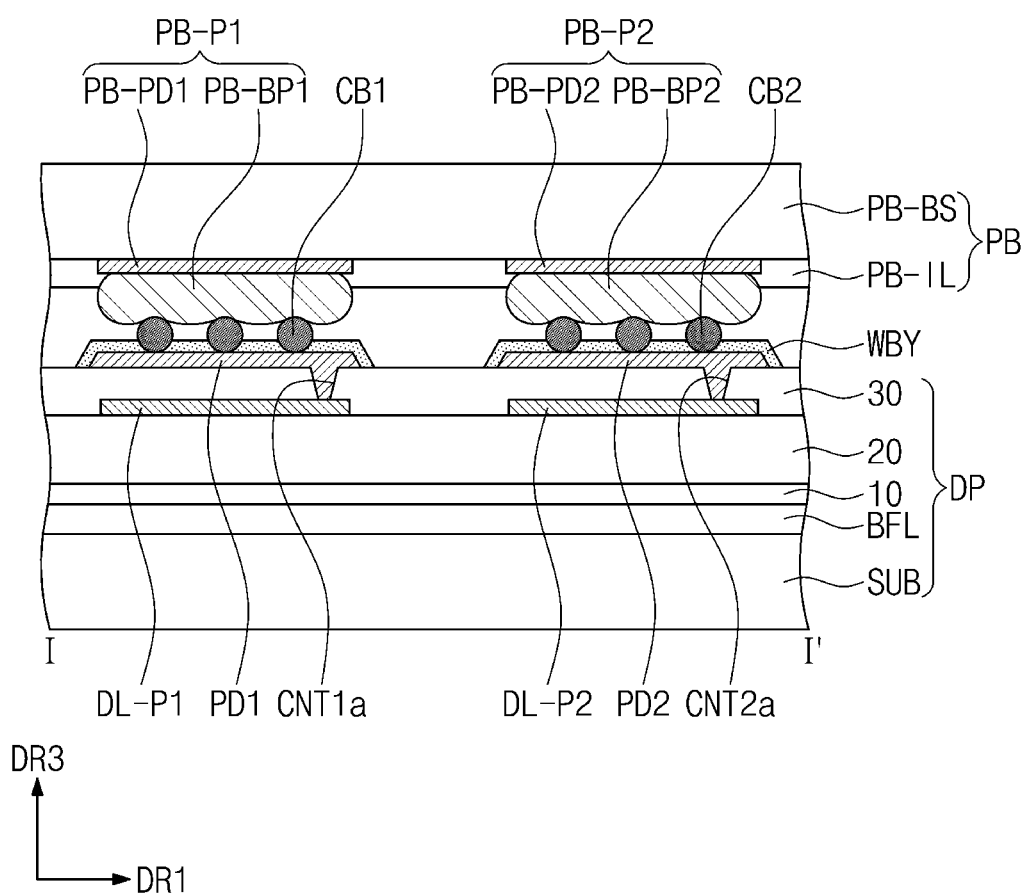
FIG. 6 is a cross-sectional view taken along line I-I' of FIG. 4B.
Figure 7:
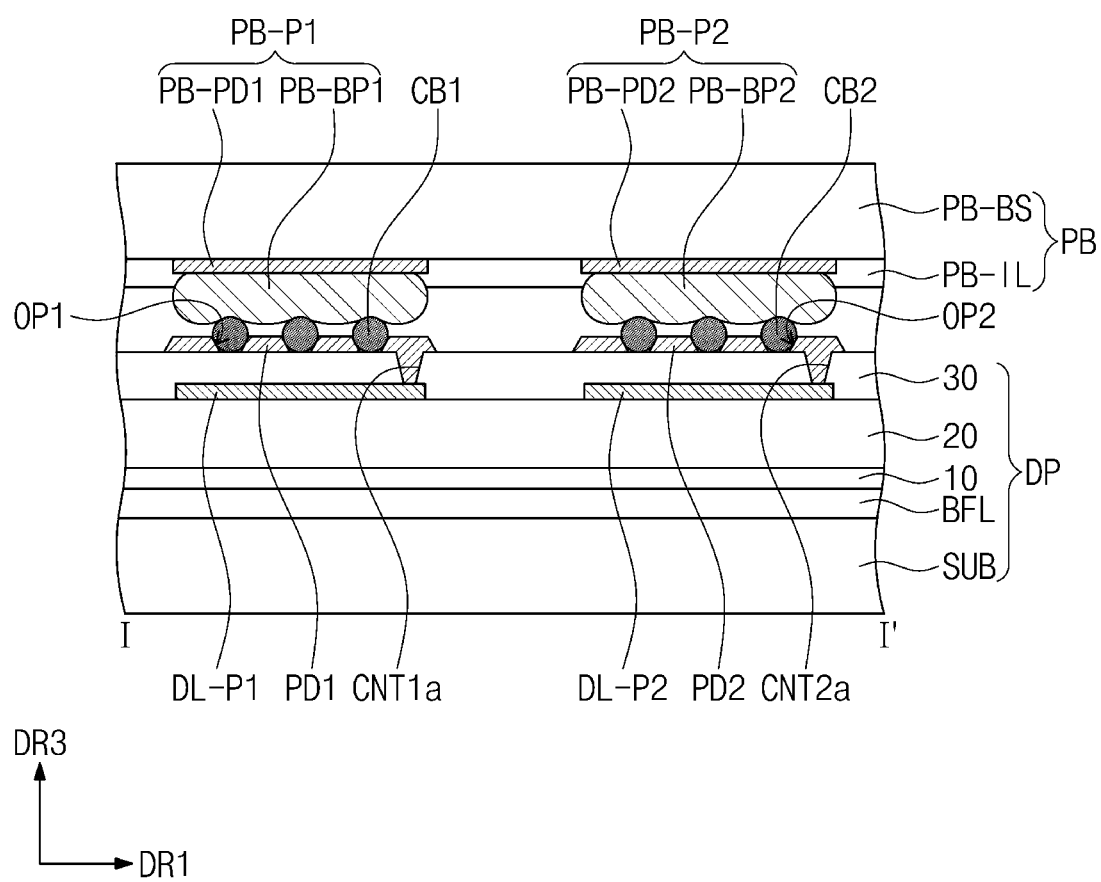
FIG. 7 is a cross-sectional view taken along line I-I' of FIG. 4B.

FIG. 6 is a cross-sectional view of a display device DD taken along line I-I' of FIG. 4B. FIG. 7 is a cross-sectional view of a display device DD taken along line I-I' of FIG. 4B.

Except for differences in the shapes of the contact hole in the third insulating layer 30 and the driving pad PD, other elements of the display panel DP of FIG. 6 may have substantially the same structure as the display panel DP of FIG. 5. In the following description of FIG. 6, the contact hole in the third insulating layer 30 and the driving pad PD will be mainly described.

Referring to FIG. 6, the first and second driving pads PD1 and PD2 may be disposed extended along the top surface of the third insulating layer 30 for a distance corresponding to a dimension of the first and second pad portions DL-P1 and DL-P2, along the first direction DR1 and/or the second direction DR2. In addition, the first driving pad PD1 may be electrically connected to the first pad portion DL-P1 at the first contact hole CNT1a defined in the third insulating layer 30, and the second driving pad PD2 may be electrically connected to the second pad portion DL-P2 at the second contact hole CNT2a defined in the third insulating layer 30.

In an embodiment, the first conductive balls CB1 may be disposed on the first driving pad PD1. Along the thickness direction of the display panel DP (e.g., third direction DR3) each of the first conductive balls CB1 faces the third insulating layer 30 with the first driving pad PD1 therebetween. More than one of the first conductive balls CB1 may not be overlapped with the first contact hole CNT1a, e.g., outside of a boundary of the first contact hole CNT1a. The first driving pad PD1 may be spaced apart from the first bump PB-BP1 by the first conductive balls CB1.

The second conductive balls CB2 may be disposed on the second driving pad PD2. Along the thickness direction of the display panel DP (e.g., third direction DR3) each of the second conductive balls CB2 faces the third insulating layer 30 with the second driving pad PD2 therebetween. More than one of the second conductive balls CB2 may not be overlapped with the second contact hole CNT2a, e.g., outside of a boundary of the second contact hole CNT2a. The second driving pad PD2 may be spaced apart from the second bump PB-BP2 by the second conductive balls CB2.

In an embodiment, the display panel DP may further include an adhesive layer WBY (e.g., adhesive pattern), which is disposed on the third insulating layer 30 to cover the first and second driving pads PD1 and PD2. That is, in a direction along the base substrate SUB (e.g., along the first direction DR1 and/or the second direction DR2) the adhesive layer WBY extends further than a boundary or planar area of the first and second driving pads PD1 and PD2, such as to cover an entirety of a planar area of the first pad (e.g., the first and second driving pads PD1 and PD2, respectively). The first and second conductive balls CB1 and CB2 may be coupled to the first and second driving pads PD1 and PD2, by the adhesive layer WBY.

In detail, the adhesive layer WBY may be spaced apart from the first and second bumps PB-BP1 and PB-BP2, and may partially cover the first and second conductive balls CB1 and CB2. That is, a space is defined between the adhesive pattern as the adhesive layer WBY and the second pad as the first and second bumps PB-BP1 and PB-BP2, for example. In an embodiment, for example, the adhesive layer WBY may expose a portion of each of the first and second conductive balls CB1 and CB2 to outside the adhesive layer WBY.

Since the first and second conductive balls CB1 and CB2 are disposed extended through the adhesive layer WBY, movement of the first and second conductive balls CB1 and CB2 relative to the first and second driving pads PD1 and PD2 may be reduced or effectively prevented. At locations where the first and second conductive balls CB1 and CB2 are extended through the adhesive layer WBY, the first and second driving pads PD1 and PD2 are effectively exposed to outside the adhesive layer WBY, and effectively, the display panel DP.

In a conventional connection structure using an anisotropic conductive film, conductive balls CB are distributed in and covered by an adhesive layer such as a resin and therefore not exposed to outside the display panel DP and/or the circuit board PB connected thereto. In one or more embodiment discussed above, with the space defined between the adhesive pattern as the adhesive layer WBY and the second pad (e.g., the first and second circuit board portions PB-P1 and PB-P2), and with the adhesive layer WBY exposing a portion of each of the conductive balls CB (e.g., the first and second conductive balls CB1 and CB2) to outside the adhesive layer WBY, the conductive balls CB on the first pad (e.g., the first and second driving pads PD1 and PD2) may be exposed to outside the display panel DP and/or the circuit board PB, different from the conventional connection structure.

From a respective pad (e.g., the first driving pad PD1 or the second driving pad PD2, a height of the each of the conductive balls CB is greater than the thickness of the adhesive pattern (e.g., adhesive layer WBY). The first and second conductive balls CB1 and CB2 may extend through a thickness of the adhesive layer WBY to contact the first and second driving pads PD1 and PD2. That is, portions of the first and second driving pads PD1 and PD2 may be exposed to outside the adhesive layer WBY, and the first and second conductive balls CB1 and CB2 may be connected to the portions of the first and second driving pads PD1 and PD2, respectively.

In an embodiment, the adhesive layer WBY may be formed of or include an organic material. In an embodiment, for example, the adhesive layer WBY may be an organic material layer such as including polyvinyl alcohol ("PVA"), sodium alginate ("SA") or poly ethylene-co-acrylic acid ("EAA"). As another example, the adhesive layer WBY may be formed of or include a combination of an organic material and an inorganic material.

Referring to FIG. 7, one or more opening may be defined in each of the first and second driving pads PD1 and PD2, to expose a portion of the third insulating layer 30 to outside the first and second driving pads PD1 and PD2. When viewed in a plan view (e.g., along the third direction DR3), a planar shape of the opening which is defined in the first and second driving pads PD1 and PD2, may be variously changed. In an embodiment, for example, the opening may be provided to have a rectangular planar shape, square planar shape, circular planar shape or parallelogram planar shape, when viewed in a plan view.

The first conductive balls CB1 may be respectively disposed in a first opening OP1 provided in plurality (e.g., first openings OP1) defined in the first driving pad PD1, and the second conductive balls CB2 may be respectively disposed in a second opening OP2 provided in plurality (e.g., second openings OP2) defined in the second driving pad PD2. Since the first and second conductive balls CB1 and CB2 are disposed extended through the first and second openings OP1 and OP2, movement of the first and second conductive balls CB1 and CB2 relative to the first and second driving pads PD1 and PD2 may be reduced or effectively prevented.

When viewed in a plan view, each of the first and second openings OP1 and OP2 may have a planar area which is smaller than a planar area of the first and second conductive balls CB1 and CB2. Thus, where the first and second conductive balls CB1 and CB2 are disposed extended into the first and second openings OP1 and OP2, the first and second conductive balls CB1 and CB2 may be in electric contact with the first and second driving pads PD1 and PD2. In detail, outer surfaces of the first and second conductive balls CB1 and CB2 may be in electric contact with side surfaces of the first and second driving pads PD1 and PD2 which define the first and second openings OP1 and OP2, respectively.

Again, in one or more embodiment discussed above, with the first and second conductive balls CB1 and CB2 extended into the first and second openings OP1 and OP2, the conductive balls CB on the first pad (e.g., the first and second driving pads PD1 and PD2) may be exposed to outside the display panel DP and/or the circuit board PB, different from the conventional connection structure.

FIGS. 8A to 8E are diagrams illustrating an embodiment of a method of fabricating a display panel DP.

A display panel DP may be provided from a preliminary form of the base substrate SUB. That is, the display panel DP may be a portion of the preliminary form of the base substrate SUB, which is separated from the preliminary form of the base substrate SUB.

Figure 8A:
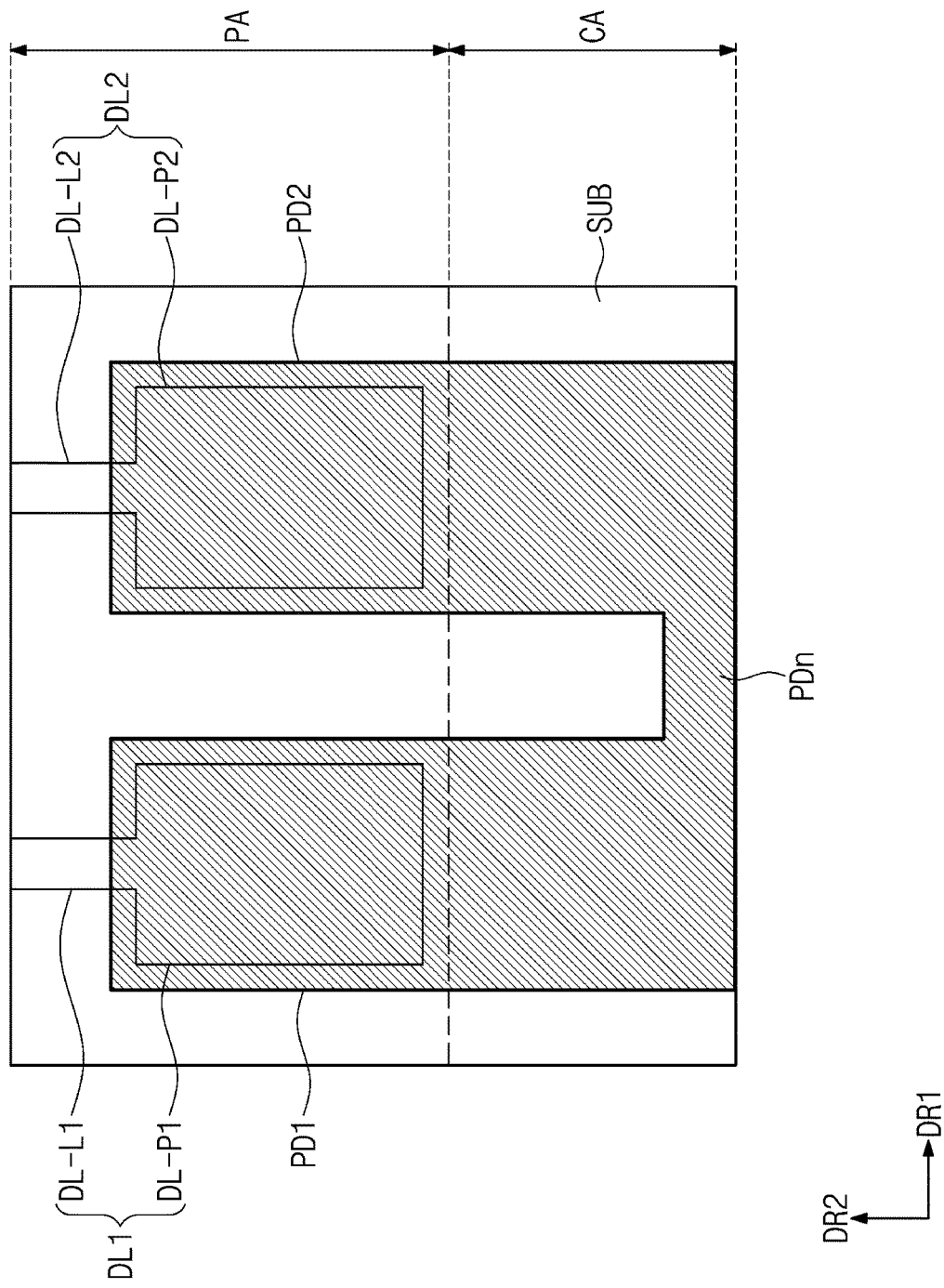
FIGS. 8A to 8E are diagrams respectively illustrating processes in an embodiment of a method of providing a display panel.

Referring to FIG. 8A, the preliminary form of the base substrate SUB may include a pad region PA and a cutting region CA. The preliminary form of the base substrate SUB may include preliminary layers of the buffer layer BFL, the first insulating layer 10, the second insulating layer 20 and the third insulating layer 30. The pad region PA and the cutting region CA may be included in the non-display area DP-NDA shown in FIG. 3.

The first data line DL1 and the second data line DL2 may be provided or formed on the preliminary form of the base substrate SUB, in the pad region PA thereof. Although not shown, the first line portion DL-L1 and the second line portion DL-L2 may be respectively provided or formed in the display area DP-DA and the non-display area DP-NDA of FIG. 3. Hereinafter, the first and second driving pads PD1 and PD2 will be referred to as the driving pads PD1 and PD2, respectively.

A shaping pad may be disposed on the base substrate SUB to cover the first pad portion DL-P1 and the second pad portion DL-P2. The shaping pad may be in the pad region PA and the cutting region CA. The shaping pad may be a preliminary form of the driving pads PD1 and PD2 in the pad region PA, and a connection pad PDn in the cutting region CA. The driving pads PD1 and PD2 and the connection pad PDn may be provided as a single conductive pattern on the preliminary form of the base substrate SUB and defining the shaping pad. The connection pad PDn may be a portion of the shaping pad which is in contact with a portion of the shaping pad corresponding to the driving pads PD1 and PD2. The connection pad PDn may be a portion of the shaping pad in contact with portions of the shaping pad corresponding to distal ends of the driving pads PD1 and PD2. Thus, the driving pads PD1 and PD2 as pad portions of the shaping pad may be electrically connected to each other.

Figure 8B:
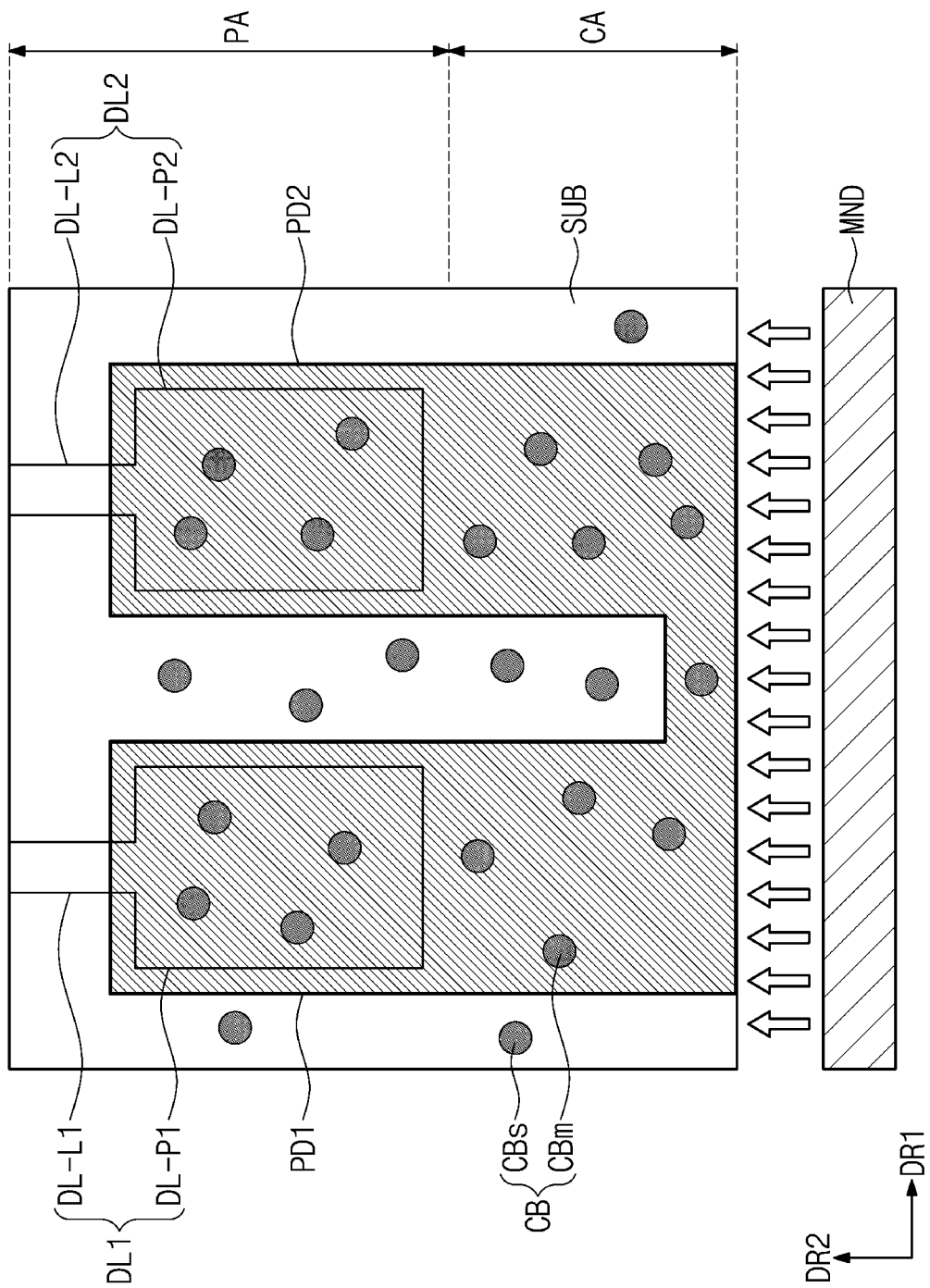

Referring to FIG. 8B, a plurality of the conductive balls CB may be distributed on the preliminary form of the base substrate SUB. In this case, the conductive balls CB may include a main conductive ball CBm provided in plurality (e.g., main conductive balls CBm or main conductive members) corresponding to the shaping pad, and a sub-conductive ball CBs provided in plurality (e.g., sub-conductive balls CBs or sub-conductive members) corresponding to a portion of the preliminary form of the base substrate SUB which is outside of the shaping pad.

Thereafter, a magnet MND (e.g., magnetic member) having a magnetic property may be disposed near the connection pad PDn. The magnet MND may be disposed adjacent to an end or edge of the preliminary form of the base substrate SUB which corresponds to the connection pad PDn. Referring to FIG. 8B, a dimension of the magnet MND along the first direction DR1 may correspond to a dimension of the connection pad PDn along the first direction DR1. Accordingly, the sub-conductive balls CBs having a conductive property may be drawn toward the shaping pad by a magnetic force from the magnet MND, such that the sub-conductive balls CBs which are outside of the shaping pad are moved to positions along a planar area defined by the shaping pad.

As a result, the conductive balls CB may be arranged to be substantially overlapped with the shaping pad. Although FIG. 8C illustrates an example, in which the conductive balls CB are aligned with each other between the driving pads PD1 and PD2, in an embodiment, the conductive balls CB may be arranged on the shaping pad in a non-aligned manner, as described above.

Due to a process error, a portion of the sub-conductive balls CBs may be overlapped with a region of the preliminary form of the base substrate SUB, which is outside of the shaping pad. According to an embodiment, where the cutting region CA is removed from a remainder of the preliminary form of the base substrate SUB, a ratio of the sub-conductive balls CBs which remain on the base substrate SUB of the display panel DP and are not overlapped with the driving pads PD1 and PD2 (e.g. are on the base substrate and outside of planar areas of the driving pads PD1 and PD2), to the conductive balls CB, is about 1% to about 5%. Thus, an electric short circuit between two adjacent driving pads PD1 and PD2 which may be caused by the sub-conductive balls CBs, may be reduced or effectively prevented.

Figure 8C:
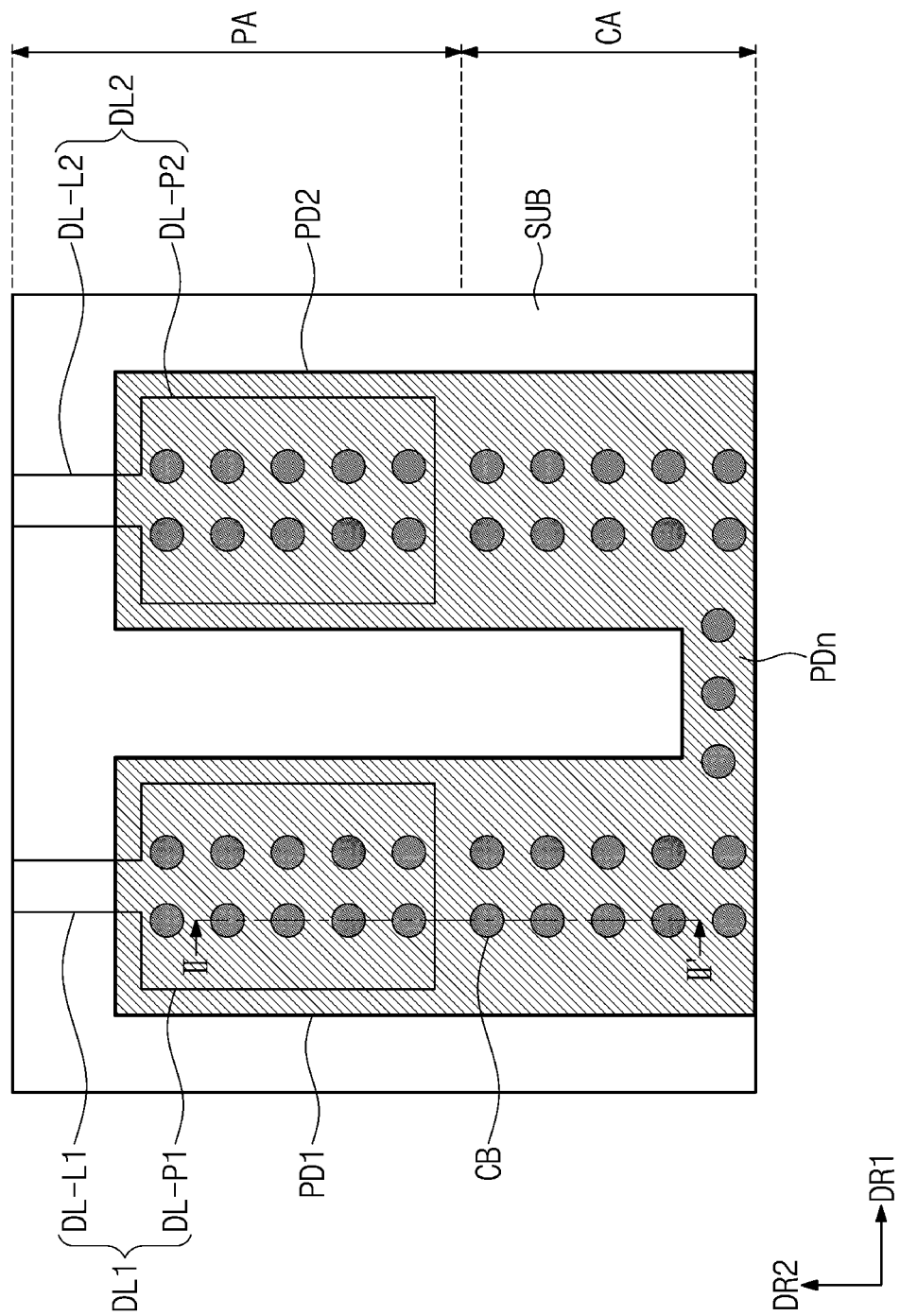
Figure 8D:
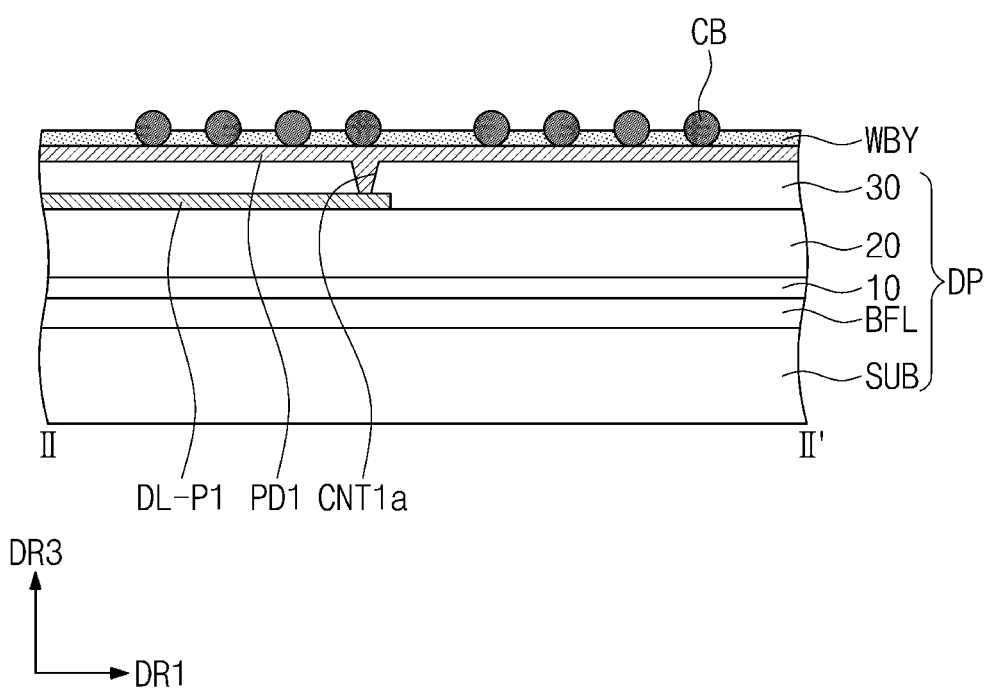

FIG. 8D illustrates a cross-sectional view taken along line II-II' of FIG. 8C. Referring to FIG. 8D, after the process described with reference to FIG. 8C, the adhesive layer WBY previously described with reference to FIG. 6 may be provided or formed on the third insulating layer 30 to cover the shaping pad. The adhesive layer WBY may be formed by providing an adhesive material on the third insulating layer 30, such as by using an external apparatus (e.g., a spraying apparatus). The adhesive layer WBY may be provided or formed to expose a portion of each of the conductive balls CB to outside the adhesive layer WBY and the display panel DP, and to have substantially the same thickness taken from a top surface of the third insulating layer 30. Here, substantially the same thickness of the adhesive layer WBY means that a variation in thickness of the adhesive layer WBY along the top surface of the third insulating layer 30 is within a process tolerance.

Referring to FIG. 8D, after providing the sub-conductive members to correspond to the planar area of one of the driving pads PD1 and PD2 or to the planar area of the connection pad PDn, an adhesive pattern (e.g., adhesive layer WBY) is provided respectively on the plurality of driving pads PD1 and PD2 and having a constant thickness relative to a respective driving pad among the driving pads PD1 and PD2.

Referring back to FIG. 8C, a cutting line may correspond to a boundary between the cutting region CA and the pad region PA which is indicated by a dotted line. The cutting line may correspond to distal ends of the driving pads PD1 and PD2. The cutting line may also correspond to an end or edge of the base substrate SUB of a display panel DP, without being limited thereto.

Figure 8E:
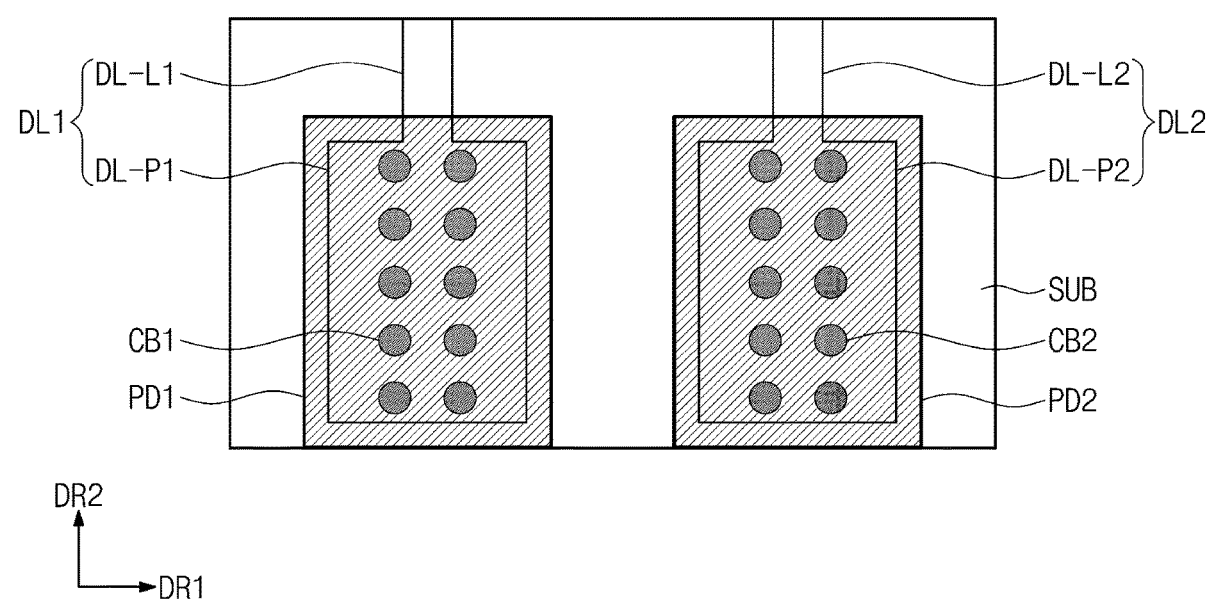

Referring to FIG. 8E, the preliminary form of the base substrate SUB at the cutting region CA may be separated from a remaining portion of the preliminary form of the base substrate SUB, such as by an external apparatus, at the cutting line. The remaining portion of the preliminary form of the base substrate SUB includes the plurality of pads (e.g., the driving pads PD1 and PD2) with the main conductive members and the sub-conductive members each corresponding to the planar areas of the plurality of pads. As a result of the separation, the connection pad PDn of the shaping pad may be removed from a remainder of the shaping pad to form the driving pads PD1 and PD2 disconnected from each other. Distal ends of the driving pads PD1 and PD2 may correspond to the boundary between the cutting region CA and the pad region PA (refer to FIG. 8C).

Although not shown, a process for an ultrasonic bonding of the display panel DP with the circuit board PB shown in FIGS. 5 to 7 may be performed.

According to one or more embodiment, bonding reliability between a display panel DP and a circuit board PB are improved.

While embodiments have been particularly shown and described, it will be understood by one of ordinary skill in the art that variations in form and detail may be made therein without departing from the spirit and scope of the attached claims.

What is claimed is:

1. A display device comprising:
a display panel including:
a base substrate, and
a first pad on the base substrate and through which an electrical signal is provided to the display panel from outside thereof, the first pad having a planar area;
an adhesive pattern which faces the base substrate with the first pad therebetween;
a circuit board electrically connected to the display panel at the first pad, the circuit board including a second pad facing the first pad; and
a plurality of conductive members which are between the first pad and the second pad which face each other and electrically connect the first pad and the second pad to each other, the plurality of conductive members each facing the base substrate with the first pad therebetween,
wherein
each of the plurality of conductive members is within the planar area of the first pad, contacts the second pad, and penetrates the adhesive pattern to contact the first pad,
a portion of the plurality of conductive members is extended outside of the adhesive pattern, and
a gap separates the adhesive pattern from the second pad.

2. The display device of claim 1, wherein a space is defined between the adhesive pattern and the second pad.

3. The display device of claim 2, wherein the adhesive pattern covers an entirety of the first pad.

4. The display device of claim 2, wherein the first pad and the second pad are spaced apart from each other with the plurality of conductive members therebetween.

5. The display device of claim 1, wherein
the display panel further includes:
an insulating layer between the first pad and the base substrate, and
a contact hole defined in the insulating layer and corresponding to the second pad of the circuit board, and
the first pad covers the contact hole in the insulating layer.

6. The display device of claim 5, wherein
the plurality of conductive members faces the insulating layer with the first pad therebetween, and
a conductive member among the plurality of conductive members overlaps the contact hole in the insulating layer.

7. The display device of claim 5, wherein an entirety of the plurality of conductive members corresponds to the contact hole.

8. A display device comprising:
a display panel including:
a base substrate,
a first pad on the base substrate and through which an electrical signal is provided to the display panel from outside thereof, the first pad having a planar area, and
an insulating layer between the first pad and the base substrate;
a circuit board electrically connected to the display panel at the first pad, the circuit board including a second pad facing the first pad; and
a plurality of conductive members which are between the first pad and the second pad which face each other and electrically connect the first pad and the second pad to each other, the plurality of conductive members each facing the base substrate with the first pad therebetween and each within the planar area of the first pad of the display panel, wherein a contact hole is defined in the insulating layer and corresponding to the second pad of the circuit board, the first pad covers the contact hole in the insulating layer, the second pad includes a first portion corresponding to the contact hole and a second portion which is adjacent to the first portion, a space is defined between the first portion of the second pad and the first pad, and the second portion of the second pad contacts the first pad.

9. A display device comprising:

a display panel including:
- a base substrate,
- a first pad on the base substrate and through which an electrical signal is provided to the display panel from outside thereof, and
- an insulating layer between the first pad and the base substrate;

a circuit board electrically connected to the display panel at the first pad, the circuit board including a second pad facing the first pad; and a plurality of conductive members which are between the first pad and the second pad which face each other and electrically connect the first pad and the second pad to each other, the plurality of conductive members each facing the base substrate with the first pad therebetween, wherein the first pad of the display panel has a planar area, each of the plurality of conductive members is within the planar area of the first pad, and the first pad defines an opening which exposes the insulating layer to outside the first pad.

10. The display device of claim 9, wherein a conductive member among the plurality of conductive members extends into the opening of the first pad.

11. The display device of claim 9, wherein along the base substrate, each of the plurality of conductive members and the opening defines a planar area, and the planar area of the opening is smaller than the planar area of each of the plurality of conductive members.

12. A display panel comprising:

a base substrate;

a pad on the base substrate and through which an electrical signal is provided to the display panel from outside thereof;

a layer which defines an opening corresponding to the pad; and conductive members on the base substrate, the conductive members comprising main conductive members each corresponding to the pad and extended into the opening of the layer, wherein the display panel is connected to a circuit board, at a pad of the circuit board, each of the main conductive members includes a portion which is further from the base substrate than the layer, the portion of the each of the main conductive members contacts the pad of the circuit board, to connect the display panel to the circuit board, and a gap separates the layer of the display panel from the pad of the circuit board.

13. The display panel of claim 12, further comprising an adhesive pattern which corresponds to the pad and faces the base substrate with the pad therebetween, wherein the adhesive pattern defines the opening into which each of the main conductive members is extended, the adhesive pattern which corresponds to the pad includes portions adjacent to each of the main conductive members, and the portions of the adhesive pattern have a same thickness.

14. The display panel of claim 12, wherein along the base substrate, the pad defines a planar area, the conductive members further comprise sub-conductive members which are on the base substrate and outside of the planar area of the pad, and a ratio of the sub-conductive members to the main conductive members ranges from about 1% to about 5%.

15. The display panel of claim 12, further comprising:

an insulating layer between the pad and the base substrate, wherein the insulating layer defines the opening into which each of the main conductive members is extended, and the main conductive members contact the pad within the opening.

16. The display panel of claim 12, further comprising:

an insulating layer between the pad and the base substrate, wherein the pad layer defines the opening into which each of the main conductive members is extended, and the opening exposes the insulating layer to outside the pad.

* * * * *